United States Patent
Wang et al.

(10) Patent No.: US 9,379,673 B2
(45) Date of Patent: Jun. 28, 2016

(54) DISTORTION CANCELLATION FOR DUAL STAGE CARRIER-AGGREGATION (CA) LOW NOISE AMPLIFIER (LNA) NON-LINEAR SECOND ORDER PRODUCTS

(71) Applicant: QUALCOMM Incorporated, San Diego, CA (US)

(72) Inventors: Chuan Wang, San Diego, CA (US); Dongling Pan, San Diego, CA (US); Yiwu Tang, San Diego, CA (US); Klaas van Zalinge, La Jolla, CA (US); Muhammad Hassan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 110 days.

(21) Appl. No.: 14/292,330

(22) Filed: May 30, 2014

(65) Prior Publication Data
US 2015/0349724 A1 Dec. 3, 2015

(51) Int. Cl.
*H03F 1/22* (2006.01)
*H03F 1/32* (2006.01)
*H03F 3/19* (2006.01)
*H03F 1/26* (2006.01)
*H04L 25/03* (2006.01)
*H03F 3/193* (2006.01)
*H03F 3/24* (2006.01)

(52) U.S. Cl.
CPC .................. *H03F 1/32* (2013.01); *H03F 1/223* (2013.01); *H03F 1/26* (2013.01); *H03F 1/3205* (2013.01); *H03F 3/19* (2013.01); *H03F 3/193* (2013.01); *H03F 3/245* (2013.01); *H04L 25/03006* (2013.01); *H03F 2200/111* (2013.01); *H03F 2200/165* (2013.01); *H03F 2200/171* (2013.01); *H03F 2200/294* (2013.01); *H03F 2200/405* (2013.01); *H03F 2200/408* (2013.01); *H03F 2200/411* (2013.01); *H03F 2200/451* (2013.01); *H03F 2201/3215* (2013.01)

(58) Field of Classification Search
CPC ....................................................... H03F 1/22
USPC .................................... 330/311, 310, 150, 98
See application file for complete search history.

(56) References Cited

U.S. PATENT DOCUMENTS

| | | | | |
|---|---|---|---|---|
| 6,208,204 | B1 * | 3/2001 | Suzuki ................. | H03F 1/3229 330/149 |
| 7,187,232 | B2 * | 3/2007 | Braithwaite .......... | H03F 1/3235 330/151 |

(Continued)

OTHER PUBLICATIONS

Co-pending U.S. Appl. No. 14/133,179, filed Dec. 19, 2013.
Chen, et al., "A Highly Linear Broadband CMOS LNA Employing Noise and Distortion Cancellation," IEEE Journal of Solid State Circuits, vol. 43, No. 5, pp. 1164-1176, May 2008.
Dehqan A R., et al., "Design of Low-Voltage Low-Power Dual-Band LNA with using DS Method to Improve Linearity", 20th Iranian Conference on Electrical Engineering (ICEE2012), IEEE, May 15, 2012, XP032231631, pp. 88-91, DOI: 10.1109/IRANIANCEE. 2012.6292329 ISBN: 978-1-4673-1149-6.

(Continued)

*Primary Examiner* — Henry Choe
(74) *Attorney, Agent, or Firm* — Smith Risley Tempel Blaha LLC (57) ABSTRACT

A device includes a main two-stage low noise amplifier (LNA) configured to amplify a carrier aggregation (CA) communication signal, the main two-stage LNA comprising a first LNA stage and a second LNA stage, an output of the first LNA stage having a first stage second order intermodulation product, the second LNA stage comprising a phase-inverter configured to phase-invert the output of the first LNA stage to generate a second stage phase-inverted output, and an auxiliary LNA stage coupled to the main two-stage LNA, the auxiliary LNA stage configured to cancel the first stage second order intermodulation product.

16 Claims, 8 Drawing Sheets

(56) References Cited

U.S. PATENT DOCUMENTS

| | | | |
|---|---|---|---|
| 7,187,234 B2 * | 3/2007 | Cavers | H03F 1/3247 330/149 |
| 7,346,134 B2 | 3/2008 | Smith | |
| 8,606,194 B2 | 12/2013 | Kaukovuori et al. | |
| 2013/0044791 A1 | 2/2013 | Rimini et al. | |
| 2013/0143510 A1 | 6/2013 | Lee et al. | |
| 2013/0315348 A1 | 11/2013 | Tasic et al. | |
| 2014/0113578 A1 | 4/2014 | Xu et al. | |

OTHER PUBLICATIONS

International Search Report and Written Opinion—PCT/US2015/032500—ISA/EPO—Oct. 19, 2015

Lai M-T., et al., "Ultra-Low-Power Cascaded CMOS LNA With Positive Feedback and Bias Optimization", IEEE Transactions on Microwave Theory and Techniques, IEEE Service Center, Piscataway, NJ, US, XP011506820, vol. 61, No. 5, May 2, 2013, pp. 1934-1945, ISSN: 0018-9480, DOI: 10.1109/TMTT. 2013.2256144.

* cited by examiner

DISTORTION CANCELLATION FOR DUAL STAGE CARRIER-AGGREGATION (CA) LOW NOISE AMPLIFIER (LNA) NON-LINEAR SECOND ORDER PRODUCTS

BACKGROUND

1. Field

The present disclosure relates generally to electronics, and more specifically to transmitters and receivers.

2. Background

In a radio frequency (RF) transceiver, a communication signal is typically received and downconverted by receive circuitry, sometimes referred to as a receive chain. A receive chain typically includes a receive filter, a low noise amplifier (LNA), a mixer, a local oscillator (LO), a voltage controlled oscillator (VCO), a baseband filter, and other components, to recover the information contained in the communication signal. The transceiver also includes circuitry that enables the transmission of a communication signal to a receiver in another transceiver. The transceiver may be able to operate over multiple frequency ranges, typically referred to a frequency bands. Moreover, a single transceiver may be configured to operate using multiple carrier signals that may occur in the same frequency band, but that may not overlap in actual frequency, an arrangement referred to as non-contiguous carriers.

In some instances, it is desirable to have a single transmitter or receiver that is configured to operate using multiple transmit frequencies and/or multiple receive frequencies. For a receiver to be able to simultaneously receive two or more receive signals, the concurrent operation of two or more receive paths is required. Such systems are sometimes referred to as "carrier-aggregation" systems. The term "carrier-aggregation" may refer to systems that include inter-band carrier aggregation and intra-band carrier aggregation. Intra-band carrier aggregation refers to the processing of two separate and non-contiguous carrier signals that occur in the same communication band. Currently, even though these non-contiguous carriers may be close together, a separate receive chain is typically needed to process each carrier. When implementing such a carrier aggregation receiver, it is possible that power from one carrier may interfere with the downconversion of another carrier (causing what is referred to as intermodulation distortion, and when occurring as a second-order function, is referred to as IM2) that can lead to desensitize the receiver, a condition sometimes referred to as "receiver desensitization" or "receiver desense." Receiver desensitization may occur due to the presence of second-order distortion caused by the operation of the low noise amplifier (LNA). The second order intercept point (IIP2) refers to a measure of linearity that quantifies the second-order distortion generated by non-linear systems and devices, in this example, the LNA.

At low power levels, the fundamental output power of the LNA rises in a one-to-one ratio (in terms of dB) with respect to the input power, while the second-order output power rises in a two-to-one ratio. If the input power is high enough for the LNA to reach saturation, the output power flattens out in both the first-order and second-order cases.

The second order intercept point (IIP2) is the output power point at which the extrapolated first- and second-order lines intersect on a plot, since the actual power levels will flatten off due to saturation at much lower power level typically.

Further, LNA IIP2 performance becomes more of a concern when the LNA input matching circuitry moves toward single inductance (L) components, particularly when the single-L matching circuitry is located on a different chip than the LNA.

It would be desirable to reduce receiver desensitization caused by second-order non-linearities, particularly those caused by the LNA.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

Exemplary embodiments of the disclosure are directed to a distortion cancellation scheme using an auxiliary path and highly-linear inverters to cancel non-linear second order distortion products of a carrier-aggregation (CA) capable low noise amplifier (LNA), and can be applied to any receiver system using a LNA to amplify a receive signal. In an exemplary embodiment, a two stage main LNA includes a first main amplification stage and a second stage having a highly-linear inverter for each carrier aggregation (CA) path. The LNA also includes an auxiliary stage configured to generate non-linear products which cancel non-linear products generated by the first main LNA stage. In an exemplary embodiment, the auxiliary LNA stage is controlled by a bias signal responsive to the amount of IIP2 cancellation desired.

Figure 1:
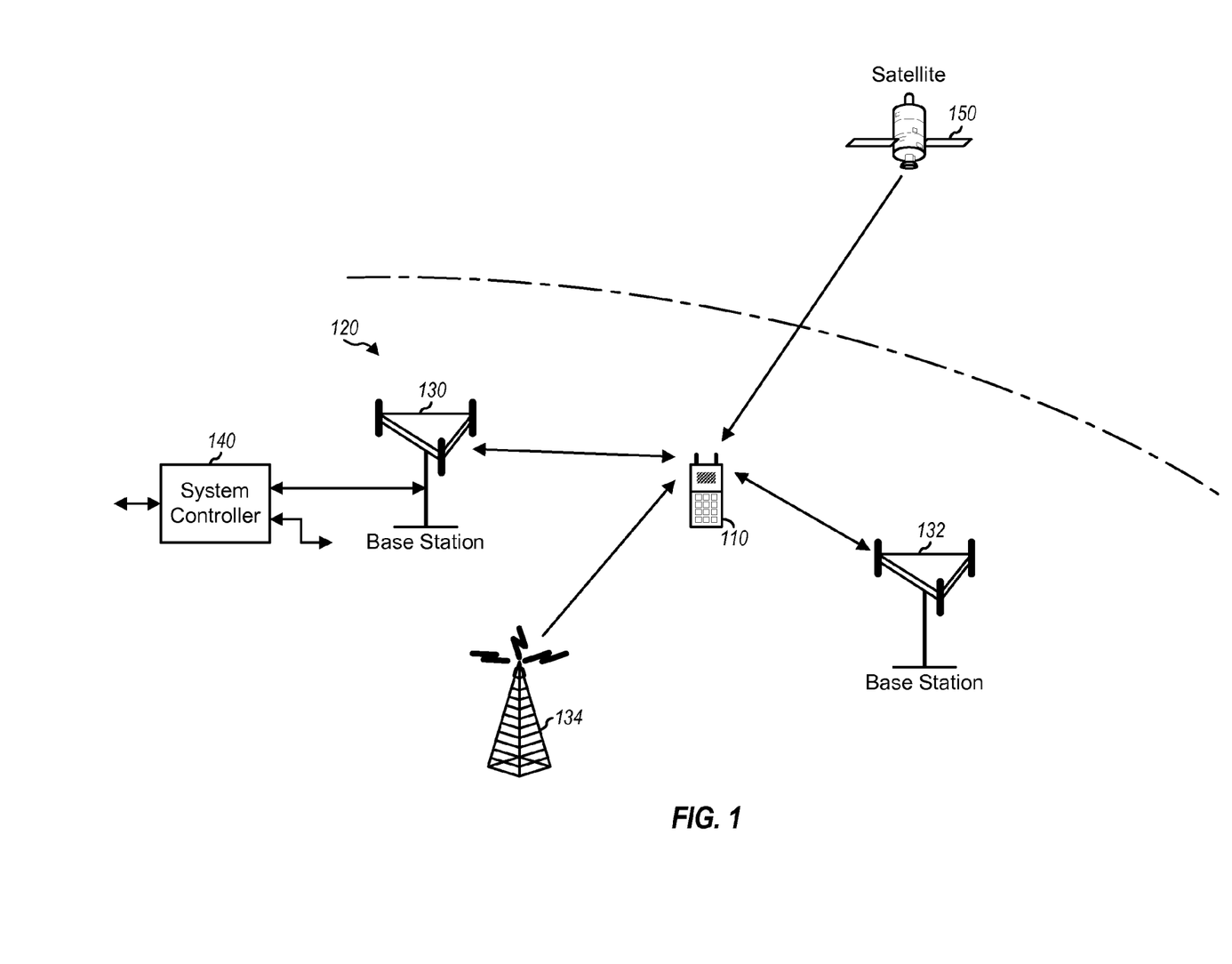
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
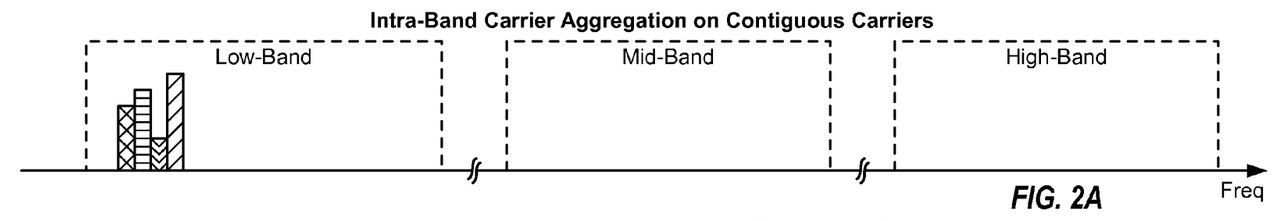
FIG. 2A is a graphical diagram showing an example of contiguous intra-band carrier-aggregation (CA).

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

Figure 2B:
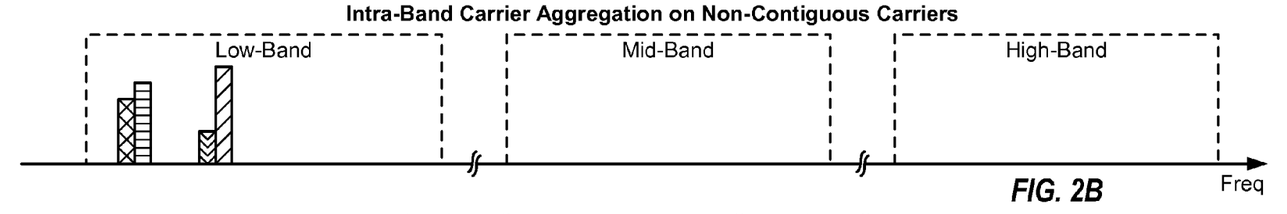
FIG. 2B is a graphical diagram showing an example of non-contiguous intra-band CA.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

Figure 2C:
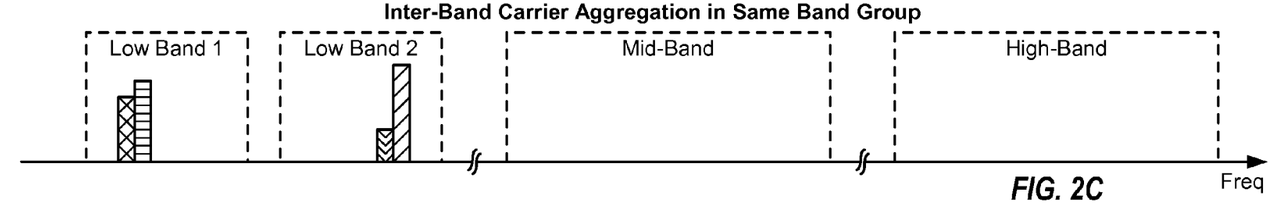
FIG. 2C is a graphical diagram showing an example of inter-band CA in the same band group.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

Figure 2D:
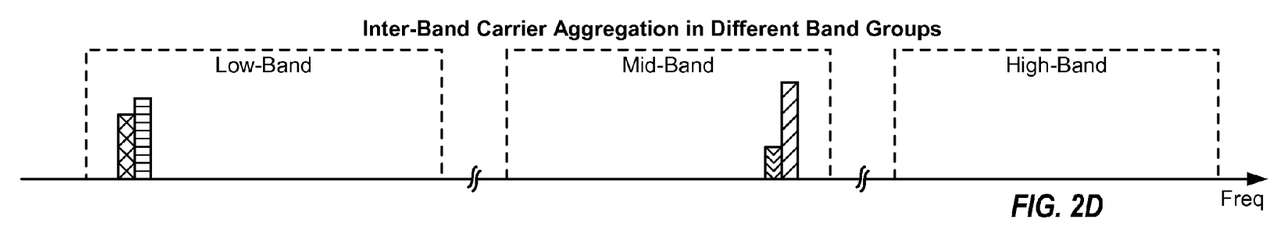
FIG. 2D is a graphical diagram showing an example of inter-band CA in different band groups.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
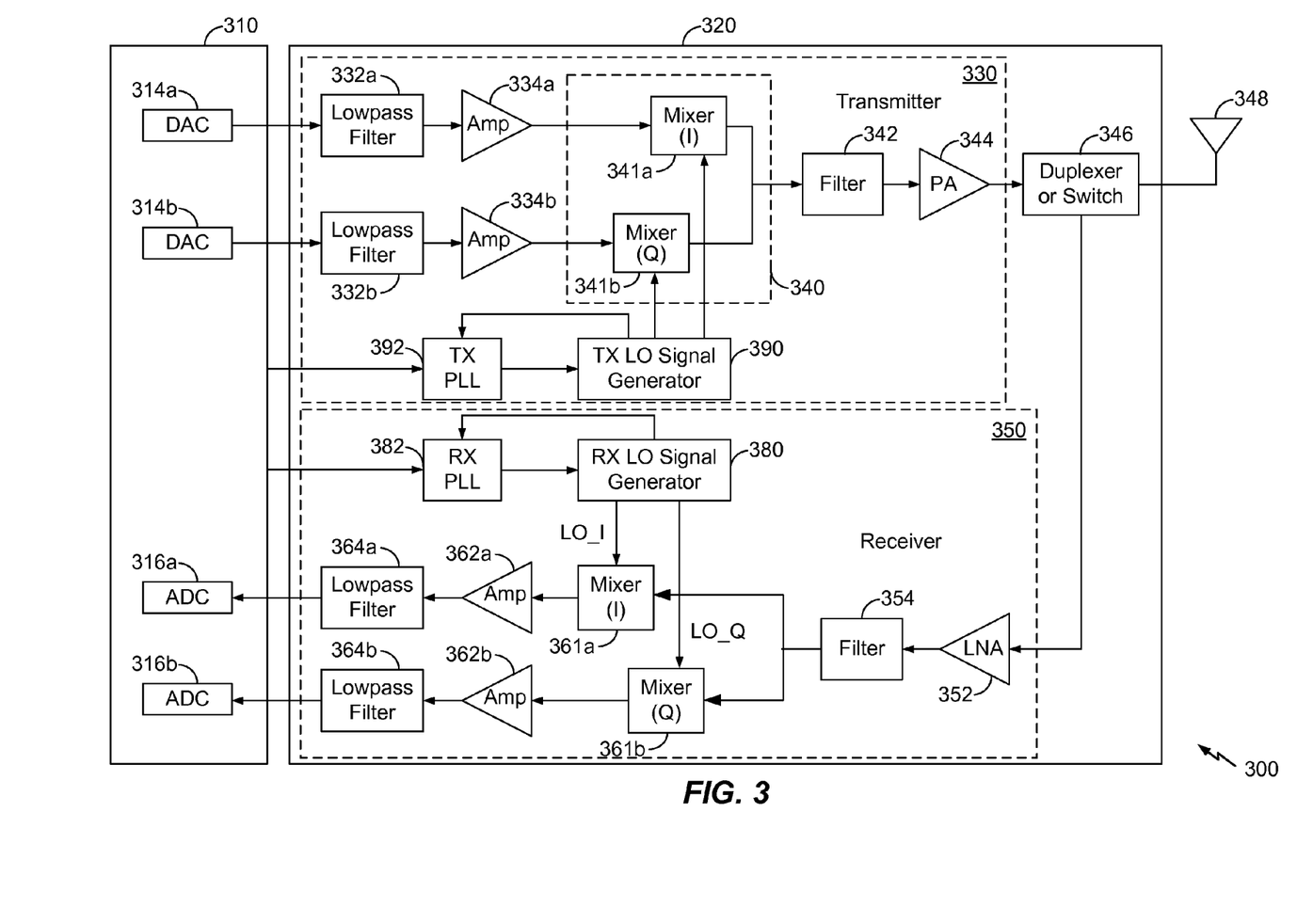
FIG. 3 is a block diagram showing a wireless device in which the exemplary techniques of the present disclosure may be implemented.

FIG. 3 is a block diagram showing a wireless device 300 in which the exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers.

In a CA communication environment where multiple receive signals are processed simultaneously, it is possible that a receive signal or an interfering signal, such as a transmit signal from an adjoining transmitter, or voltage controlled oscillator (VCO) leakage from a particular receive path can couple to and impair the sensitivity of a receiver operating on a receive signal on a different receive path.

In an exemplary embodiment of the present disclosure, non-linear second order intermodulation (IM2) products, also referred to herein as non-linear second order products, generated by the LNA are substantially cancelled to mitigate any degradation in NF caused by the above-mentioned undesirable coupling of receive energy from one receive path to another receive path, or from other interfering signals coupled to the subject receive path. Reducing the non-linear second order intermodulation (IM2) products generated by the LNA improves the second order intercept point (IIP2) performance of the receiver, and thus makes the receiver less-susceptible to interference from another receive path, or from interfering signals in general.

Figure 4:
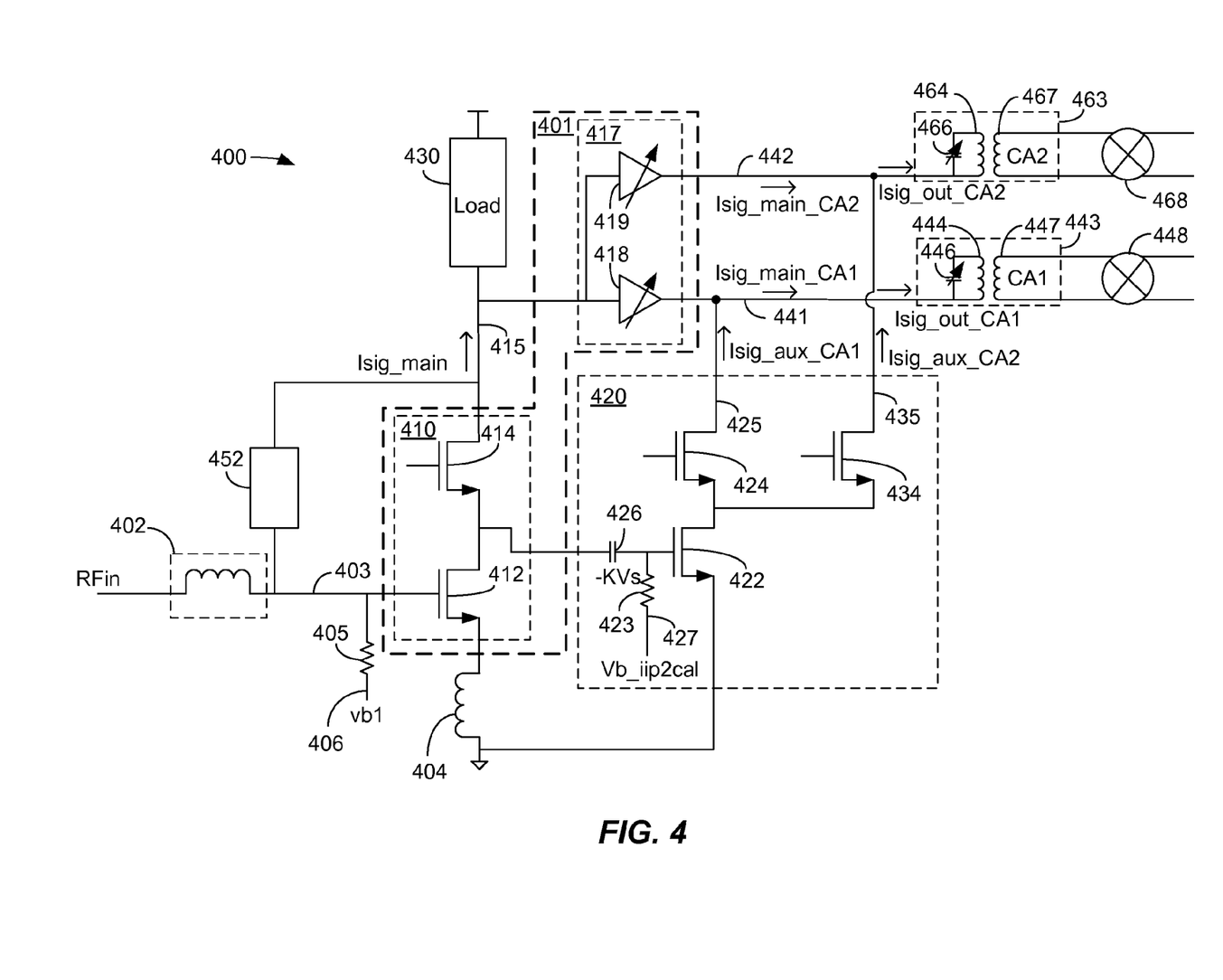
FIG. 4 is a schematic diagram illustrating an exemplary embodiment of a circuit having a two stage low noise amplifier (LNA) that can be used to cancel non-linear second order products in the two stage LNA.

FIG. 4 is a schematic diagram illustrating an exemplary embodiment of a circuit 400 having a two stage low noise amplifier (LNA) 401 that can be used to cancel non-linear second order products in the LNA 401. A single-ended radio frequency (RF) input signal is provided through a single-element matching circuit 402 to a first LNA stage 410. The first LNA stage 410 comprises a transistor 412 and a transistor 414. In an exemplary embodiment, the transistor 412 operates as a gain transistor and the transistor 414 operates as a cascode transistor. The transistor 412 is biased by a signal, vb1, on connection 406 applied to its gate through a resistance 405. The bias signal, vb1, can be provided by a bias circuit (not shown). The single-ended RF input signal on connection 403 is provided to the gate of the transistor 412. The source of the transistor 412 is connected to a source degeneration inductor 404. The drain of the transistor 412 is coupled to the source of the transistor 414. The output of the first LNA stage 410 is provided from the drain of the transistor 414 to a load circuit 430 over connection 415. The current flowing in connection 415 can be referred to as "Isig_main." The load circuit 430 can be an inductive circuit having a characteristic load and impedance.

The exemplary embodiment shown in FIG. 4 includes a feedback circuit 452. The feedback circuit 452 can be a passive feedback circuit comprising one or more of resistances, inductances and capacitances, or can be an active feedback circuit comprising resistances, inductances, capacitances and gain devices. The feedback circuit 452 provides feedback to achieve the desired 50 ohm input impedance matching instead of using a multiple-element input matching network, for example, when using an external inductance 402 as an input matching circuit.

The LNA 401 also comprises a second LNA stage 417 comprising a highly-linear inverter 418 and a highly-linear inverter 419. The second LNA stage 417 is highly-linear to tolerate any jammer signal amplified by the first LNA stage 410.

In an exemplary embodiment, the LNA 401 can be configured to operate in a carrier-aggregation (CA) mode in which more than one radio frequency (RF) output signal is generated from the RF input signal, RF_in. In an exemplary embodiment, the LNA 401 is configured to provide a first carrier output, CA1 and a second carrier output, CA2. However, the LNA 401 can be configured to provide more than two carrier output signals. In an exemplary embodiment, the highly-linear inverter 418 can be configured to process a CA1 output signal and the highly-linear inverter 419 can be configured to process a CA2 output signal. The output of the highly-linear inverter 418 is provided over connection 441 to a first transformer 443. The output of the highly-linear inverter 419 is provided over connection 442 to a second transformer 463.

The first transformer 443 comprises a primary side 444 and a secondary side 447. A variable capacitor 446 is coupled across the primary side 444. A single-ended RF communication signal is provided to the primary side 444 of the transformer 443 and converted to a differential output on the secondary side 447. The output of the transformer 443 is provided from the secondary side 447 as a differential RF signal to a mixer 448 for downconversion and further processing.

The second transformer 463 comprises a primary side 464 and a secondary side 467. A variable capacitance 466 is coupled across the primary side 464. A single-ended RF communication signal is provided to the primary side 464 of the transformer 463 and converted to a differential output on the secondary side 467. The output of the transformer 463 is provided from the secondary side 467 as a differential RF signal to a mixer 468 for downconversion and further processing.

The circuit 400 also comprises an auxiliary LNA stage 420. The auxiliary LNA stage 420 comprises a transistor 422, a transistor 424 and a transistor 434. In an exemplary embodiment, the transistor 422 operates as a gain transistor and the transistors 424 and 434 operate as cascode transistors. The transistor 422 is controlled and biased by a signal, Vb_iip2cal, on connection 427 applied to its gate through a resistor 423. The bias signal, Vb_iip2cal, can be provided by a bias circuit (not shown) to set the gain of the transistor 422. The gate of the transistor 422 is connected to the drain of the transistor 412 through a capacitor 426. The drain of the transistor 422 is coupled to the source of the transistor 424 and to the source of the transistor 434. The source of the transistor 422 is coupled to the degeneration inductance 404. The output of the auxiliary LNA stage 420 is provided from the drain of the transistor 424 on connection 425 to the output of the highly-linear inverter 418 on connection 441; and from the drain of the transistor 434 over connection 435 to the output of the highly-linear inverter 419 on connection 442. In this exemplary embodiment, there is one cascode transistor 424 and 434 for each carrier output CA1 and CA2, respectively. In alternative exemplary embodiments, additional cascode transistors can be implemented in the auxiliary LNA stage 420 depending on the number of carriers.

The current flowing in connection 425 can be referred to as "Isig_aux_CA1" and the current flowing in connection 435 can be referred to as "Isig_aux_CA2." "Isig_aux_CA1" and "Isig_aux_CA2" can be generated correspondingly by controlling the transistor 424 and the transistor 434. When the transistor 424 is enabled, the transistor 434 is turned off, the current "Isig_aux_CA1" is generated and combined with the current "Isig_main_CA1", to generate the current "Isig_out_CA1," which travels to the CA1 transformer 443. When the transistor 434 is enabled, the transistor 424 is turned off, the current "Isig_aux_CA2" is generated and combined with the current "Isig_main_CA2", to generate the current "Isig_out_CA2," which travels to the CA2 transformer 463. In this exemplary embodiment, only "Isig_aux_CA1" or "Isig_aux_CA2" can be generated at a time and used to cancel the corresponding CA path. An alternative exemplary embodiment that allows independent IIP2 cancelation for both the CA1 signal path and the CA2 signal path is shown below.

To minimize current consumption in the auxiliary LNA stage 420, the physical size of the transistors 422, 424 and 434 is generally smaller than the physical size of the transistors 412 and 414, respectively, so that the current Isig_aux_CA1 on connection 425 and the current Isig_aux_CA2 on connection 435 is smaller than the current Isig_main on connection 415 such that the signal generated by the auxiliary LNA stage 420 is smaller than the signal generated by the main LNA stage 410. In operation, the transistor 422 is generally biased in a non-linear region so that non-linear second order products generated by the auxiliary LNA stage 420 are proportional to and can cancel the non-linear second order products generated by the main LNA stage 410, even though the transistors 422, 424 and 434 are respectively smaller than the transistors 412 and 414. In this manner, the operation of the auxiliary LNA stage 420 generally cancels non-linear second order (and all even order) products generated by the transistor 412.

The highly-linear inverters 418 and 419 can be adjusted by a control signal from, for example, the data processor 310, to provide variable gain. Having a variable second-stage gain provided by the highly-linear inverters 418 and 419 and by biasing the transistor 422 with the control signal Vb_iip2cal, allows any IM2 current generated by the main LNA stage 410 and the auxiliary LNA stage 420 to cancel each other. Any IM2 products generated by the highly-linear inverters 418 and 419 is negligible because in an exemplary embodiment, the highly-linear inverters 418 and 419 can each be implemented using NMOS and PMOS devices, which provides intrinsic IM2 cancellation.

The highly-linear inverters 418 and 419 phase-invert the signal on connection 415, and provide outputs that are combined with the current outputs of the auxiliary LNA stage 420 on connections 425 and 435, respectively, and then provided to the transformers 443 and 463. The highly-linear inverters 418 and 419 should be sufficiently linear to tolerate jammer signals that may be amplified by the main LNA stage 410. The inverter function of the highly-linear inverters 418 and 419 changes the phase of the main current, Isig_main by 180 degrees, thus allowing the IM2 current component in Isig_main to be canceled when combined with the IM2 current component in Isig_aux from the auxiliary LNA stage 420.

The current Isig_main is given by:

$$Isig\_main = g_1 \cdot Vs + g_2 \cdot Vs^2 + g_3 \cdot Vs^3 \qquad (Eq. 1)$$

The current Isig_aux is given by:

$$Isig\_aux = K \cdot g_1' \cdot (-Vs) + K \cdot g_2' \cdot Vs^2 + K \cdot g_3' \cdot (-Vs)^3 \qquad (Eq. 2)$$

The current Isig_out is given by:

$$Isig\_out = -(Isig\_main - Isig\_aux) = -((g_1 + Kg_1') \cdot Vs + (g_2 - Kg_2') \cdot Vs^2 + (g_3 + Kg_3') \cdot Vs^3) \qquad (Eq. 3)$$

The inverter introduces the phase inversion between Isig_main and Isig_aux, then the output $2^{nd}$ order IM2 current $(g_2 - Kg_2') \cdot Vs^2$ can be canceled to 0 by proper setting of $g_2$ and $g_2'$.

The terms "$g_1$" and "$g_1'$" refer to the "effective" transconductance of the transistors 412 and 422, respectively. The term −K refers to the gain of Vs at the drain of the transistor 412. The term $(g_2 - Kg_2') \cdot Vs^2$ can be cancelled by biasing the transistor 422 at the point where the second-order products can be maximized, i.e., the point at which "$g_2'$" is maximized. The term "$g_2'$" refers to the first order differential of the term "$g_1'$" with respect to the gate-source voltage (Vgs) of the transistor 422.

Exemplary embodiments of the auxiliary LNA stage 420 can be incorporated into an existing LNA architecture and can be enabled and disabled dynamically with a control signal over connection 427 depending on a number of factors including, for example, whether second order non-linearity cancellation is needed. For example, the auxiliary LNA stage 420 can be activated only when carrier aggregation is present that can benefit from the second order cancellation. It saves the current when carrier aggregation is present without any IIP2 desense resulting from the LNA.

Figure 5A:
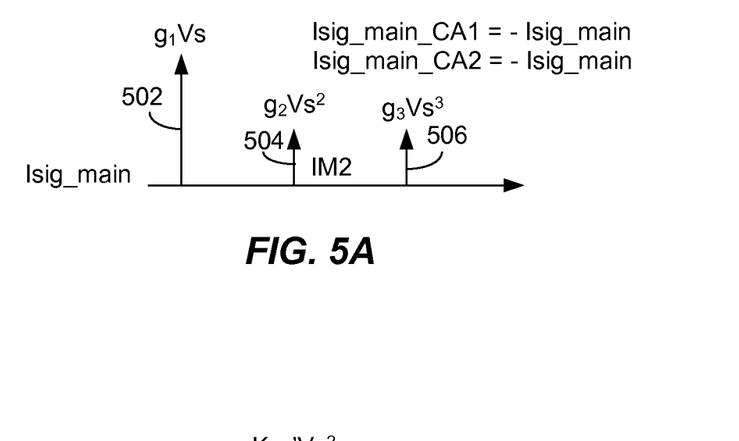
FIGS. 5A, 5B and 5C are diagrams illustrating the currents generated by the two stage LNA of FIG. 4.
Figure 5B:
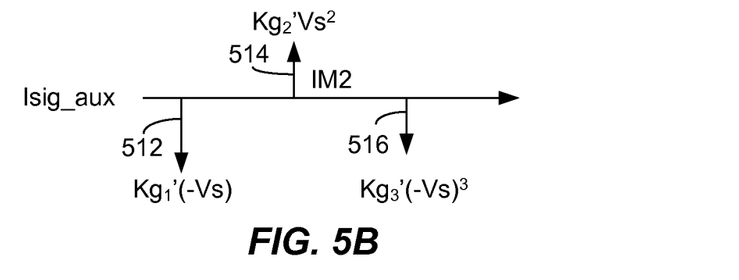
Figure 5C:
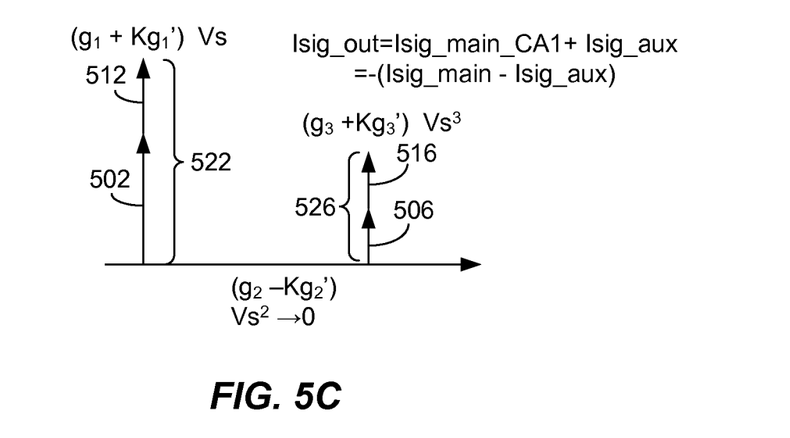

FIGS. 5A, 5B and 5C are diagrams illustrating the currents generated by the two stage LNA of FIG. 4. FIG. 5A shows the current Isig_main having a $g_1 \cdot Vs$ component 502, a $g_2 \cdot Vs^2$ second order component 504 and a $g_3 \cdot Vs^3$ third order component 506. Both the currents Isig_main_CA1 and Isig_main_CA2 are inverted instances of the current Isig_main.

FIG. 5B shows the current Isig_aux having a $K \cdot g_1' \cdot (-Vs)$ component 512, a $K \cdot g_2' \cdot Vs^2$ second order component 512 and a $K \cdot g_3' \cdot (-Vs)^3$ third order component 516.

FIG. 5C shows the current Isig_out having a $(g_1 + Kg_1') \cdot Vs$ component 522, which includes an inverted version of the $g_1 \cdot Vs$ component 502 added to the $K \cdot g_1' \cdot (-Vs)$ component 512; and a $(g_3 + Kg_3') \cdot Vs^3$ third order component 526, which includes an inverted version of the $g_3 \cdot Vs^3$ third order component 506 and the $K \cdot g_3' \cdot (-Vs)^3$ third order component 516. However, the $g_2 \cdot Vs^2$ second order component 504 and the $K \cdot g_2' \cdot Vs^2$ second order component 512 cancel when the inverted instance of Isig_main is combined with Isig_aux, resulting in the reduction of the second order component and a reduction in the IM2.

Figure 6:
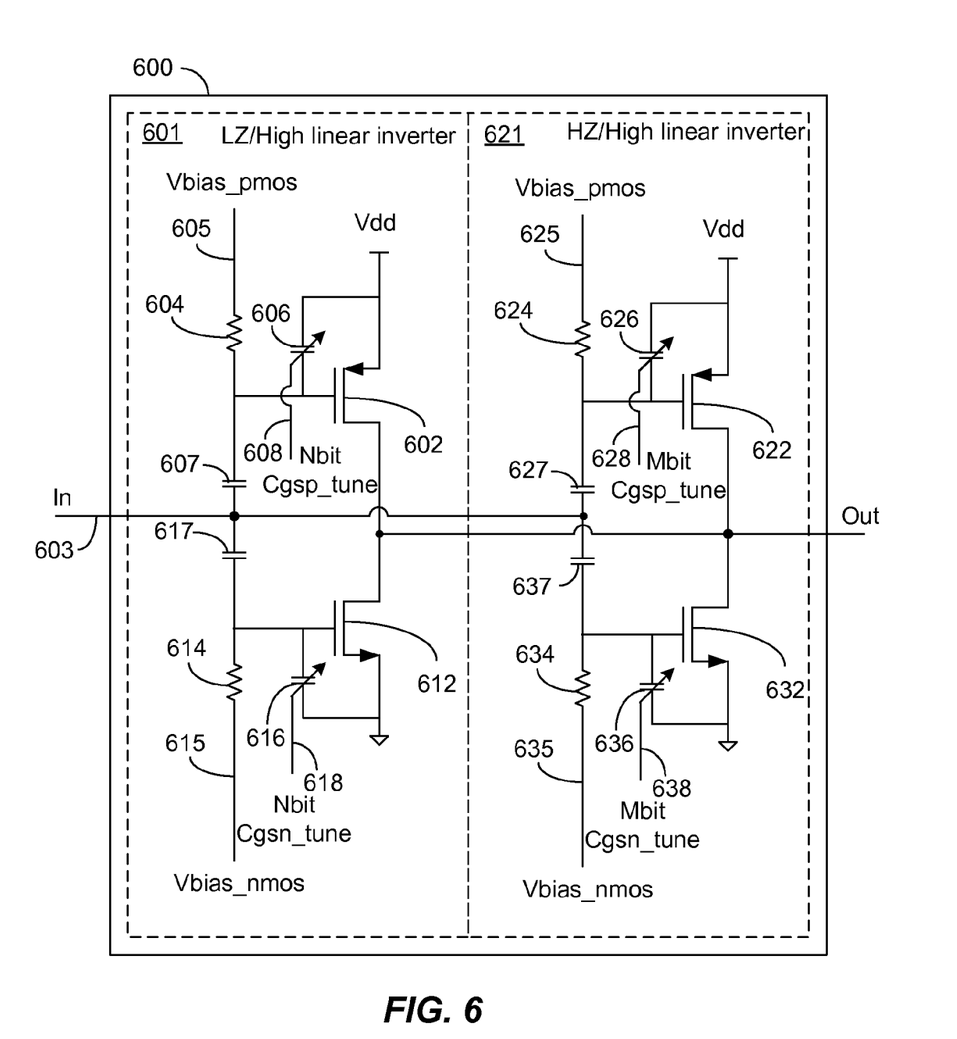
FIG. 6 is a schematic diagram illustrating an exemplary embodiment of a highly-linear inverter of FIG. 4.

FIG. 6 is a schematic diagram illustrating an exemplary embodiment of a highly-linear inverter of FIG. 6. The highly-linear inverter 600 comprises a low impedance (LZ) highly linear inverter section 601 and a high impedance (HZ) highly-linear inverter section 621.

The LZ highly-linear inverter section 601 comprises a PMOS transistor 602, an adjustable capacitance 606, a resistance 604 and a capacitance 607. The LZ highly linear inverter section 601 also comprises an NMOS transistor 612, an adjustable capacitance 616, a resistance 614 and a capacitance 617. A bias signal, Vbias_pmos is provided over connection 605 to the gate of the transistor 602 through the resistance 604. A bias signal, Vbias_nmos is provided over connection 615 to the gate of the transistor 612 through the resistance 614. In an exemplary embodiment, the adjustable capacitance 606 can be adjusted by an N bit gate-source tuning signal (Cgsp_tune), provided over connection 608 from the data processor 310. In an exemplary embodiment, the adjustable capacitance 616 can also be adjusted by the N bit gate-source tuning signal, (Cgsn_tune), provided over connection 618 from the data processor 310. The number of tunable capacitors (N) is determined by the gain variation the system uses to set different gain modes, which in an exemplary embodiment, can range from one to four, but in other exemplary embodiment may be other values.

The HZ highly linear inverter section 621 comprises a PMOS transistor 622, an adjustable capacitance 626, a resistance 624 and a capacitance 627. The HZ highly-linear inverter section 621 also comprises an NMOS transistor 632, an adjustable capacitance 636, a resistance 634 and a capacitance 637. A bias signal, Vbias_pmos is provided over connection 625 to the gate of the transistor 622 through the resistance 624. A bias signal, Vbias_nmos is provided over connection 635 to the gate of the transistor 632 through the resistance 634. In an exemplary embodiment, the adjustable capacitance 626 can be adjusted by an M bit gate-source tuning signal (Cgsp_tune), provided over connection 628 from the data processor 310. In an exemplary embodiment, the adjustable capacitance 636 can also be adjusted by the M bit gate-source tuning signal, (Cgsp_tune), provided over connection 638 from the data processor 310. The number of tunable capacitors (M) is determined by the gain variation the system uses to set different gain modes, which in an exemplary embodiment, can range from one to four, but in other exemplary embodiment may be other values.

The impedance difference between the LZ highly-linear inverter section 601 and the HZ highly-linear inverter section 621 is determined by the capacitances 607 and 617 in the LZ highly-linear inverter section 601 and the capacitances 627 and 637 in the HZ highly-linear inverter section 621.

At RF frequencies, the capacitances 607 and 617 behave like short circuits, thus providing a low impedance (LZ) path to AC-couple the input signal from connection 603 to the gates of the gain-amplifying transistors 602 and 612.

The capacitances 627 and 637 are relatively small compared to the capacitances 607 and 617, respectively, and at RF frequencies operate to "block" or attenuate the signal on connection 603 before the signal on connection 603 is applied to the gates of the gain-amplifying transistors 622 and 632. Only the LZ highly-linear inverter section 601 or the HZ highly-linear inverter section 621 is enabled at a particular time, depending on the desired gain variation. For example, the LZ highly-linear inverter section 601 may provide one or two dB of gain variation, while the HZ highly-linear inverter section 621 may provide 10 or more dB of gain variation.

The NMOS/PMOS configuration of the highly-linear inverter 600 provides intrinsic IM2 cancellation, so that the highly-linear inverters 418 and 419 do not add any appreciable IM2 products to the signal on connections 441 and 442 (FIG. 6).

Figure 7:
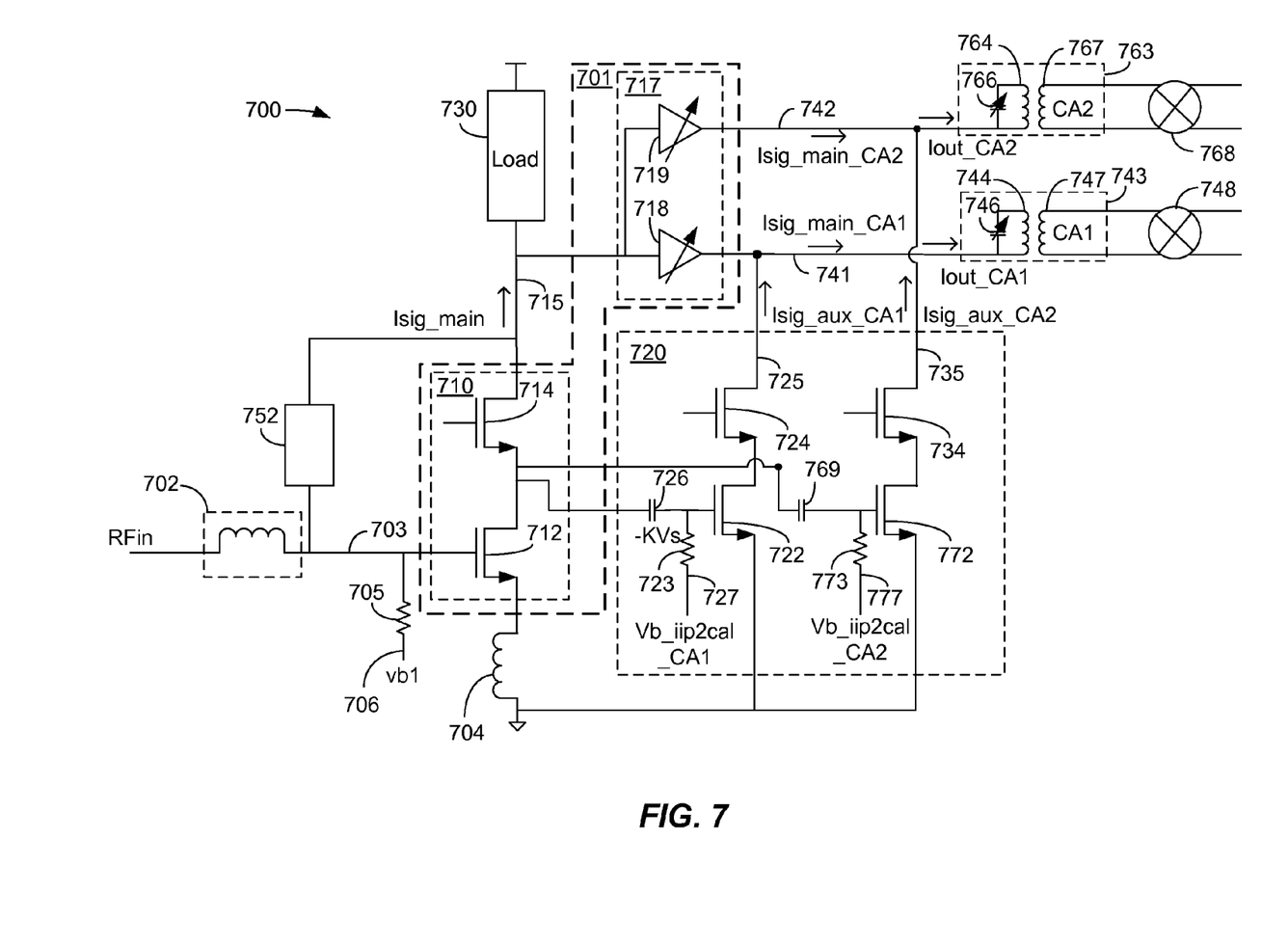
FIG. 7 is a schematic diagram illustrating an alternative exemplary embodiment of the circuit of FIG. 4.

FIG. 7 is a schematic diagram illustrating an alternative exemplary embodiment of the circuit of FIG. 4. In an exemplary embodiment, the circuit 700 comprises a two stage low noise amplifier (LNA) 701 that can be used to cancel non-linear second order products in the LNA 701. A single-ended radio frequency (RF) input signal is provided through a single-element matching circuit 702 to a first LNA stage 710. The first LNA stage 710 comprises a transistor 712 and a transistor 714. In an exemplary embodiment, the transistor 712 operates as a gain transistor and the transistor 714 operates as a cascode transistor. The transistor 712 is biased by a signal, vb1, on connection 706 applied to its gate through a resistance 705. The bias signal, vb1, can be provided by a bias circuit (not shown). The single-ended RF input signal on connection 703 is provided to the gate of the transistor 712. The source of the transistor 712 is connected to a source degeneration inductance 704. The drain of the transistor 712 is coupled to the source of the transistor 714. The output of the first LNA stage 710 is provided from the drain of the transistor 714 to a load circuit 730 over connection 715. The current flowing in connection 715 can be referred to as "Isig_main." The load circuit 730 can be an inductive circuit having a characteristic load and impedance.

The exemplary embodiment shown in FIG. 7 includes a feedback circuit 752. The feedback circuit 752 can be a passive feedback circuit comprising one or more of resistances, inductances and capacitances, or can be an active feedback circuit comprising resistances, inductances, capacitances and gain devices. The feedback circuit 752 provides feedback to achieve the desired 50 ohm input impedance matching instead of using a multiple-element input matching network, for example, when using an external inductance 702 as an input matching circuit.

The LNA 701 also comprises a second stage 717 comprising a highly-linear inverter 718 and a highly-linear inverter 719. The highly-linear inverter 718 and the highly-linear inverter 719 are similar to the highly-linear inverter 418 and the highly-linear inverter 419 described herein.

In an exemplary embodiment, the LNA 701 can be configured to operate in a carrier-aggregation (CA) mode in which more than one radio frequency (RF) output signal is generated from the RF input signal, RF_in. In an exemplary embodiment, the LNA 701 is configured to provide a first carrier output, CA1 and a second carrier output, CA2. However, the LNA 701 can be configured to provide more than two carrier output signals. In an exemplary embodiment, the highly-linear inverter 718 can be configured to process a CA1 output signal and the highly-linear inverter 719 can be configured to process a CA2 output signal. The output of the highly-linear inverter 718 is provided over connection 741 to a first transformer 743. The output of the highly-linear inverter 719 is provided over connection 742 to a second transformer 763.

The first transformer 743 comprises a primary side 744 and a secondary side 747. A variable capacitance 746 is coupled across the primary side 744. A single-ended RF communication signal is provided to the primary side 744 of the transformer 743 and converted to a differential output on the secondary side 747. The output of the transformer 743 is provided from the secondary side 747 as a differential RF signal to a mixer 748 for downconversion and further processing.

The second transformer 763 comprises a primary side 764 and a secondary side 767. A variable capacitance 766 is coupled across the primary side 764. A single-ended RF communication signal is provided to the primary side 764 of the transformer 763 and converted to a differential output on the secondary side 767. The output of the transformer 763 is provided from the secondary side 767 as a differential RF signal to a mixer 768 for downconversion and further processing.

The circuit 700 also comprises an auxiliary LNA stage 720. The auxiliary LNA stage 720 is similar to the auxiliary LNA stage 420, except that the auxiliary LNA stage 720 comprises an additional gain transistor. The auxiliary LNA stage 720 comprises a transistor 722, a transistor 772, a transistor 724 and a transistor 734. In an exemplary embodiment, the transistor 722 operates as a gain transistor and the transistors 724 operates as a cascode transistor. Similarly, the transistor 772 operates as a gain transistor and the transistor 734 operates as a cascode transistor. The transistor 722 is controlled and biased by a signal, Vb_iip2cal_CA1, on connection 727 applied to its gate through a resistor 723. The transistor 772 is controlled and biased by a signal, Vb_iip2cal_CA2, on connection 777 applied to its gate through a resistor 773.

The bias signals, Vb_iip2cal_CA1 and Vb_iip2cal_CA2, can be provided by a bias circuit (not shown) to set the gain of the transistors 722 and 772. Accordingly, the current Isig_aux_CA1 flowing through the transistors 722 and 724 and the current Isig_aux_CA2 flowing through the transistors 772 and 734 can be controlled by the respective bias signals Vb_iip2cal_CA1 and Vb_iip2cal_CA2 to be the same or different even if the transistors 722 and 772, and the transistors 724 and 734 share similar physical features and structure.

The gate of the transistor 722 is connected to the drain of the transistor 712 through a capacitance 726 and the gate of the transistor 772 is connected to the drain of the transistor 712 through a capacitance 769. The drain of the transistor 722 is coupled to the source of the transistor 724. The source of the transistor 722 is coupled to the degeneration inductance 704. The drain of the transistor 772 is coupled to the source of the transistor 734. The source of the transistor 772 is coupled to the degeneration inductance 704.

The output of the auxiliary LNA stage 720 is provided from the drain of the transistor 724 on connection 725 to the output of the highly-linear inverter 718 on connection 741; and from the drain of the transistor 734 over connection 735 to the output of the highly-linear inverter 719 on connection 742. In this exemplary embodiment, there is one gain transistor 722 and one cascode transistor 724 for the carrier output CA1 and one gain transistor 772 and one cascode transistor 734 for the carrier output CA2. In alternative exemplary embodiments, additional gain transistors and additional cascode transistors can be implemented in the auxiliary LNA stage 720 depending on the number of carriers.

The current flowing in connection 725 can be referred to as "Isig_aux_CA1" and the current flowing in connection 735 can be referred to as "Isig_aux_CA2." In an exemplary embodiment, having a separate gain transistor for each carrier signal in the auxiliary LNA stage 720 allows independent IIP2 calibration for each of the CA1 and CA2 signal paths through the respective bias signals Vb_iip2cal_CA1 and Vb_iip2cal_CA2.

To minimize current consumption in the auxiliary LNA stage 720, the physical size of the transistors 722, 724, 772 and 734 is generally smaller than the physical size of the transistors 712 and 714, respectively, so that the current Isig_aux_CA1 on connection 725 and the current Isig_aux_CA2 on connection 735 is smaller than the current Isig_main on connection 715 such that the signal generated by the auxiliary LNA stage 720 is smaller than the signal generated by the main LNA stage 710. In operation, the transistors 722 and 772 are generally biased in a non-linear region so that non-linear second order products generated by the auxiliary LNA stage 720 can be generated which are higher than and which can cancel the non-linear second order products generated by the main LNA stage 710, even though the transistors 722, 724, 772 and 734 are respectively smaller than the transistors 712 and 714. In this manner, the operation of the auxiliary LNA stage 720 generally cancels non-linear second order (and all even order) products generated by the transistor 712.

The highly-linear inverters 718 and 719 are similar to the highly-linear inverters 418 and 419 and can be adjusted by a control signal from, for example, the data processor 310, to provide variable gain. Having a variable second-stage gain provided by the highly-linear inverters 718 and 719 and by biasing the transistors 722 and 772 with the respective control signal Vb_iip2cal_CA1 and Vb_iip2cal_CA2, allows any IM2 current generated by the main LNA stage 710 and the auxiliary LNA stage 720 to cancel each other. Any IM2 products generated by the highly-linear inverters 718 and 719 is negligible because in an exemplary embodiment, the highly-linear inverters 718 and 719 can each be implemented using NMOS and PMOs devices, which provides intrinsic IM2 cancellation, as described herein.

The highly-linear inverters 718 and 719 phase-invert the signal on connection 715, which output is combined with the current outputs of the auxiliary LNA stage 720 on connections 725 and 735, respectively, and then provided to the transformers 743 and 763. The highly-linear inverters 718 and 719 should be sufficiently linear to tolerate any jammer signals that may be amplified by the main LNA stage 710. The inverter function of the highly-linear inverters 718 and 719 changes the phase of the main current, Isig_main by 180 degrees, thus allowing the IM2 current component in Isig_main to be canceled when combined with the IM2 current component in Isig_aux_Cal and Isig_aux_CA2 from the auxiliary LNA stage 720.

Exemplary embodiments of the auxiliary LNA stage 720 can be incorporated into an existing LNA architecture and can be enabled and disabled dynamically with a control signal over connections 727 and 777 depending on a number of factors including, for example, whether second order non-linearity cancellation is needed. For example, the auxiliary LNA stage 720 can be activated only when carrier aggregation is present that can benefit from the second order cancellation.

Figure 8:
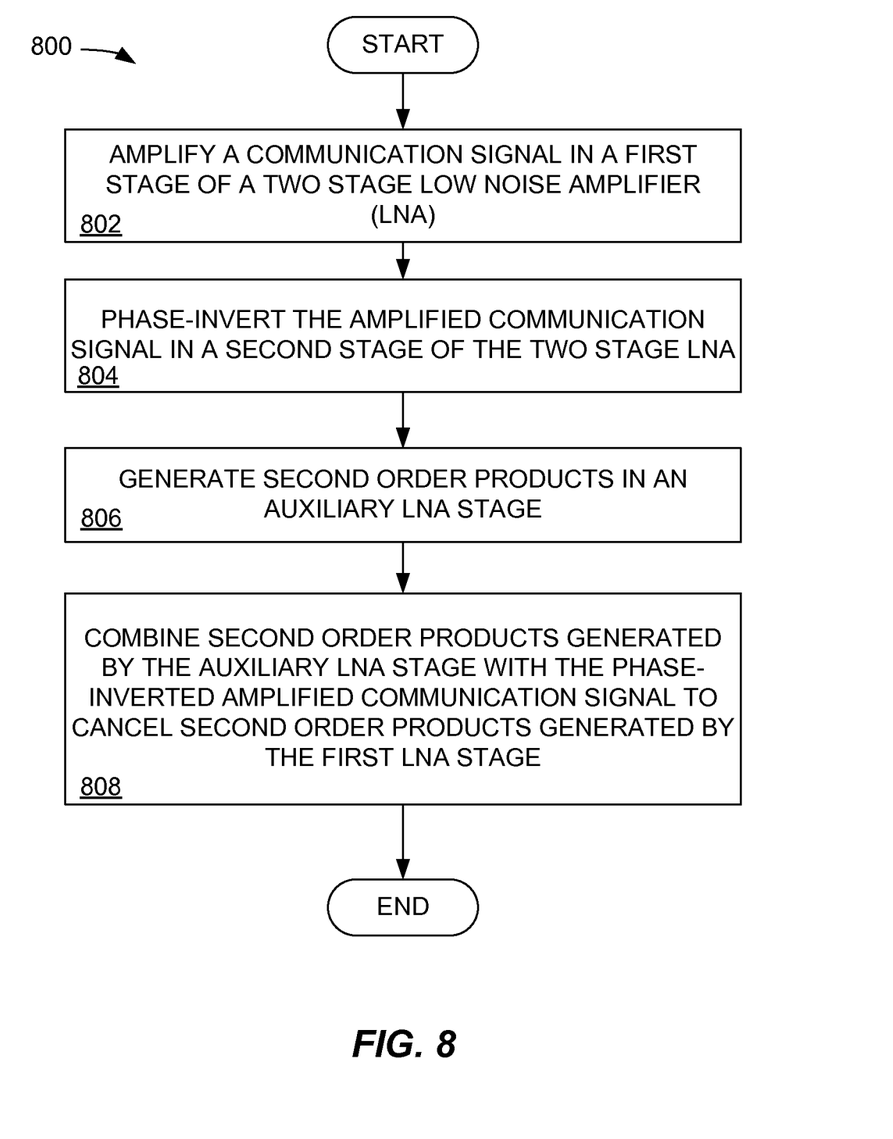
FIG. 8 is a flow chart describing the operation of an exemplary embodiment of a circuit having a two stage low noise amplifier (LNA) that can be used to cancel non-linear second order distortion products in the LNA.

FIG. 8 is a flow chart 800 describing the operation of an exemplary embodiment of a circuit having a two stage low noise amplifier (LNA) that can be used to cancel second order distortion products in the LNA. The blocks in the flow chart 800 can be performed in or out of the order shown, and in some embodiments, can be performed at least in part in parallel.

In block 802, a communication signal is amplified in a first stage of a two stage low noise amplifier (LNA) having a first LNA stage and a second LNA stage. In block 804, the amplified communication signal is phase-inverted in the second stage of the two stage LNA.

In block 806, non-linear second order products are generated by an auxiliary LNA stage.

In block 808, the non-linear second order products generated by the auxiliary LNA stage are combined with the phase-inverted amplified communication signal to cancel non-linear second order products generated by the first LNA stage.

The LNA circuit described herein may be implemented on one or more ICs, analog ICs, RFICs, mixed-signal ICs, ASICs, printed circuit boards (PCBs), electronic devices, etc. The LNA circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the LNA circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A device, comprising:
a main two-stage low noise amplifier (LNA) configured to amplify a carrier aggregation (CA) communication signal, the main two-stage LNA comprising a first LNA stage and a second LNA stage, an output of the first LNA stage coupled to an input of the second LNA stage, the first LNA stage configured to produce a first stage output signal at the output of the first LNA stage having a first stage second order intermodulation product, the second LNA stage comprising a phase-inverter configured to phase-invert the first stage output signal to generate a second stage phase-inverted output signal at an output of the second LNA stage; and
an auxiliary LNA stage coupled to the first LNA stage of the main two-stage LNA, the auxiliary LNA stage configured to cancel the first stage second order intermodulation product of the first stage output signal when a non-phase-inverted output of the auxiliary LNA stage is combined with the second stage phase-inverted output signal.

2. The device of claim 1, wherein the auxiliary LNA stage further comprises a first gain transistor configured to be biased in a non-linear region and configured to generate a first auxiliary current having a first auxiliary second order intermodulation product proportional to the first stage second order intermodulation product.

3. The device of claim 2, wherein the first auxiliary current generated by the auxiliary LNA stage is combined with the second stage phase-inverted output signal and provided to a transformer.

4. The device of claim 2, wherein the phase-inverter comprises an adjustable gain and the auxiliary LNA stage is configured to be biased such that the first auxiliary second order intermodulation product cancels the first stage second order intermodulation product.

5. The device of claim 2, wherein the phase-inverter comprises a PMOS/NMOS structure having intrinsic second order intermodulation product cancellation.

6. The device of claim 2, wherein the auxiliary LNA stage further comprises a second gain transistor configured to be biased in a non-linear region and configured to generate a second auxiliary current having a second auxiliary second order intermodulation product, the first auxiliary current and the second auxiliary current configured to be combined with respective first and second phase-inverted output signals of the second LNA stage.

7. The device of claim 6, wherein the first and second auxiliary currents cancel second order intermodulation products in the respective first and second phase-inverted output signals of the second LNA stage.

8. The device of claim 6, wherein the main two-stage LNA is configured to simultaneously amplify a carrier aggregation (CA) communication signal having a first carrier and a second carrier.

9. A method, comprising:

amplifying a communication signal in first stage of a two stage low noise amplifier (LNA) having a first LNA stage and a second LNA stage, an output of the first LNA stage coupled to an input of the second LNA stage, the amplified communication signal having a first stage second order intermodulation product;

phase-inverting the amplified communication signal in the second stage LNA;

generating a non-phase-inverted auxiliary current having an auxiliary second order intermodulation product in an auxiliary LNA stage coupled to the first stage of the two stage LNA; and combining the non-phase-inverted auxiliary current with the phase-inverted amplified communication signal to cancel the first stage second order intermodulation product.

10. The method of claim 9, further comprising biasing the auxiliary LNA stage in a non-linear region to generate the auxiliary current having the auxiliary second order intermodulation product.

11. The method of claim 10, further comprising:

combining the phase-inverted amplified communication signal with the auxiliary current to develop a combined signal; and converting the combined signal to a differential signal.

12. The method of claim 10, further comprising:

adjusting a gain of the phase-inverted amplified communication signal; and biasing the auxiliary LNA stage such that the auxiliary second order intermodulation product cancels the first stage second order intermodulation product.

13. A device, comprising:

means for amplifying a communication signal in first stage of a two stage low noise amplifier (LNA) having a first LNA stage and a second LNA stage, an output of the first LNA stage coupled to an input of the second LNA stage, the amplified communication signal having a first stage second order intermodulation product;

means for phase-inverting the amplified communication signal in the second stage LNA;

means for generating a non-phase-inverted auxiliary current having an auxiliary second order intermodulation product in an auxiliary LNA stage coupled to the first stage of the two stage LNA; and means for combining the non-phase-inverted auxiliary current with the phase-inverted amplified communication signal to cancel the first stage second order intermodulation product.

14. The device of claim 13, further comprising means for biasing the auxiliary LNA stage in a non-linear region to generate the auxiliary current having the auxiliary second order intermodulation product.

15. The device of claim 14, further comprising:

means for combining the phase-inverted amplified communication signal with the auxiliary current to develop a combined signal; and means for converting the combined signal to a differential signal.

16. The device of claim 14, further comprising:

means for adjusting a gain of the phase-inverted amplified communication signal; and means for biasing the auxiliary LNA stage such that the auxiliary second order intermodulation product cancels the first stage second order intermodulation product.

* * * * *